United States Patent [19]

Sommer

[11] 4,078,477
[45] Mar. 14, 1978

[54] PROTECTIVE SCREEN, ESPECIALLY A PROTECTIVE SCREEN FOR DRIFT SAND, FOR AN ELECTRICAL AIR-COOLED MACHINE

[75] Inventor: Hans Dieter Sommer, Oberrohrdorf, Switzerland

[73] Assignee: BBC Brown Boveri & Comapny Limited, Baden, Switzerland

[21] Appl. No.: 716,670

[22] Filed: Aug. 23, 1976

[30] Foreign Application Priority Data

Jun. 30, 1976 Switzerland .......................... 8349/76

[51] Int. Cl.² .............................................. F24F 13/08
[52] U.S. Cl. ................................................. 98/121 R
[58] Field of Search ................ 310/56, 58, 53, 59, 310/64, 62, 63, 51, 85, 88, 66, 89; 174/16 R; 361/383, 384; 98/121 R, 40 VM

[56] References Cited

U.S. PATENT DOCUMENTS

| 311,784 | 2/1885 | Reille | 98/121 |
|---|---|---|---|
| 1,385,995 | 8/1921 | Hellmund | 310/56 |
| 1,783,276 | 12/1930 | Bliss | 98/121 |
| 2,082,335 | 6/1937 | Hart | 98/121 |
| 2,123,287 | 7/1938 | Ney | 98/18 |
| 2,354,466 | 7/1944 | Levinsen | 98/121 |
| 3,125,941 | 3/1964 | Grout | 98/18 |
| 3,461,791 | 8/1969 | Beyer | 98/40 VM |
| 3,576,378 | 4/1971 | Hilmanowski | 310/63 |
| 3,625,136 | 12/1971 | Dininno | 98/121 |
| 3,831,350 | 8/1974 | Gilles | 98/40 VM |

FOREIGN PATENT DOCUMENTS

| 671,835 | 10/1963 | Canada | 98/18 |
|---|---|---|---|
| 863,557 | 4/1941 | France | 98/121 |
| 531,113 | 12/1940 | United Kingdom | 98/18 |

*Primary Examiner*—R. Skudy
*Attorney, Agent, or Firm*—Werner W. Kleeman

[57] ABSTRACT

A protective screen or grating, especially a protective screen or grating for drift or blown sand or the like, for an electrical air-cooled machine, comprising essentially vertically arranged profile ledge members disposed in at least two rows, the profile ledge members being provided with at least one row of guide devices located downstream with respect to the flow direction of the cooling air and forming channel walls.

14 Claims, 4 Drawing Figures

PROTECTIVE SCREEN, ESPECIALLY A PROTECTIVE SCREEN FOR DRIFT SAND, FOR AN ELECTRICAL AIR-COOLED MACHINE

BACKGROUND OF THE INVENTION

The present invention relates to a new and improved construction of protective grating or screen, especially a protective screen for drift sand or the like, for an electrical air-cooled machine, comprising essentially vertically arranged profile ledge members or profile members disposed at least in two rows.

In the case of rotating electrical machines, which suck-up cooling air from the ambient surroundings, the air inlet- and outlet openings are arranged either directly at the machine housing or at a weather protective cabinet which is mounted upon the machine. The weather protective cabinets serve for mounting air filters and sound dampening devices. In those instances where the rotating electrical machinery is inherently aerated, only limited pressure differences are available for transporting the cooling air. It is therefore necessary that all elements of the cooling air-guide arrangement, part of which also is constituted by the protective devices at the inlet- and outlet openings, exhibit extremely small pressure losses. If there is required protection against so-called drift or blown sand, then there is employed a sand separator grating or screen which consists of mutually offset V-profile members. Such drift sand-protective screen or grating has been disclosed, for instance, in the brochure "L+M Ansaug-Luftungs-Jalousie" appearing in Lufttechnik + Metallbau AG, Wettingen, Switzerland. Such screen or grating should produce extremely small pressure losses, so that when generating the same pressure the machine ventilators or fans can convey larger cooling air currents through the machine. If this is not necessary then the weather protection cabins can be constructed smaller.

SUMMARY OF THE INVENTION

It is a primary object of the present invention to provide an improved construction of protective screen or grating, especially a protective grating for drift sand, for electrical air-cooled machines, which is extremly reliable and efficient in operation.

Another and more specific object of the present invention aims at the provision of a protective screen or grating, especially a drift sand-protective grating for an electrical air-cooled machine, producing smaller pressure losses and insuring for good protection against drift or blown sand and the like.

Now in order to implement these and still further objects of the invention, which will become more readily apparent as the description proceeds, the profile ledge members are provided with at least one row of guide devices located downstream with respect to the flow direction of the cooling air, the guide devices forming channel walls.

The advantage of the invention resides in the fact that the protective grating or screen considerably reduces the pressure loss in comparison to heretofore known constructions. Measurements have shown a reduction in the pressure loss of less than 85% of the original value.

According to a preferred manifestation of the invention the guide devices are longer in the flow direction of the cooling air than the height of the profile ledge members in this direction. The profile ledge members can exhibit a profile or cross-section which at least is essentially V-shaped. This construction is extremely simple. According to a further manifestation of the invention the profile ledge members possess an at least essentially U-shaped profile or cross-section. This constructional embodiment has the advantage that for the U-shaped profiles there are present a number of separation zones. It is advantageous if the U-shaped cross-section of the profile ledge members is formed of three straight of linear portions. it is beneficial if the angle which the side portions or legs of the U-shaped profile of the profile ledge members form with the intermediate portion or web, is greater than 90° and smaller than 160°. According to a further construction, the profile ledge members are arranged in two rows with the open parts of the V-shaped and U-shaped profiles disposed towards one another, and the profile ledge members of the second row are offset with respect to the profile ledge members of the first row such that the spaces between the profile ledge members of the first row are situated opposite the profile ledge members of the second row. The guide devices forming the channel walls can be arranged in parallel planes or in a diffusor-like manner. The advantage of such constructional embodiment resides in the fact that due to the sudden widening or enlargement of the diffusor-like guide devices there is obtained a static pressure gain. It is advantageous if the guide devices forming the channel walls or members are connected with the front edges, with respect to the flow direction of the cooling air, of the profile ledge members of the row located downstream of the flow direction, and the front edges of the profile ledges and/or the guide devices have rounded surfaces. According to a further embodiment the profile ledge members of the flow outward situated row are formed of one-piece with the guide devices.

BRIEF DESCRIPTION OF THE DRAWINGS

The invention will be better understood and objects other than those set forth above, will become apparent when consideration is given to the following detailed description thereof. Such description make reference to the annexed drawings wherein.

DETAILED DESCRIPTION OF THE PREFERRED EMBODIMENTS

Figure 1:
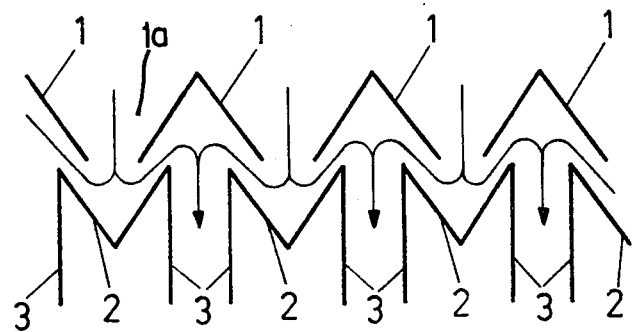
FIG. 1 is a horizontal cross-sectional view through a drift sand-protective grating having substantially V-shaped profile ledges or members.
Figure 2:
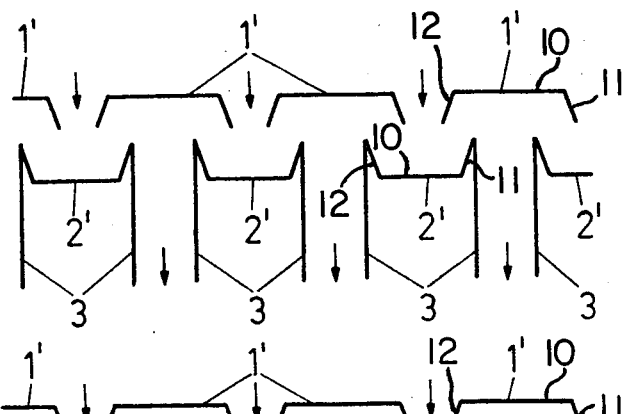
FIG. 2 illustrates an embodiment of the drift sand-protective screen or grating with substantially U-shaped profile ledge members.
Figure 3:
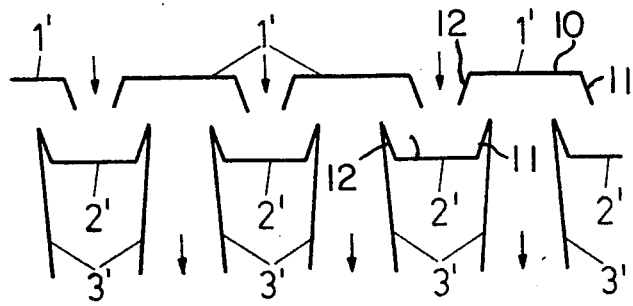
FIG. 3 illustrates a further embodiment of the drift sand-protective screen or grating with U-shaped profile ledge members.
Figure 4:
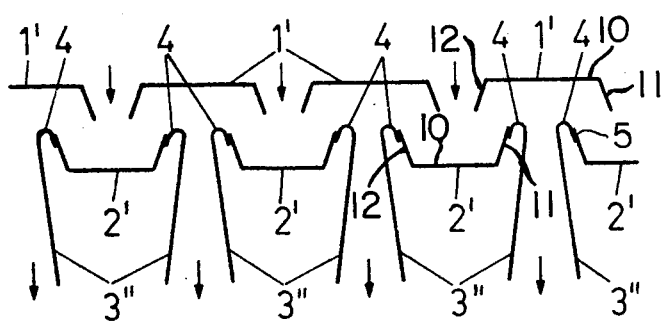
FIG. 4 illustrates a still further embodiment of the drift sand-protective screen or grating with U-shaped profile ledges.

Describing now the drawings, according to the showing of FIG. 1 substantially V-shaped profile ledge members or profile members of a first row are represented by reference character 1 and substantially V-shaped profile ledge members or profile members of a second row by reference character 2. Guide devices are indicated by reference character 3. In FIGS. 2 to 4 the substantially U-shaped profile ledge members are represented by the reference characters 1' in the first row and by 2' in the second row. The guide devices in FIG. 2 are represented by reference character 3, in FIG. 3 by reference character 3' and in FIG. 4 by reference character 3". The arrows, in all of the Figures, indicate the flow directions of the cooling air. Reference character 4 designates the rounded surfaces of the guide devices 3" of FIG. 4, but such rounded surfaces may be provided instead or also on the profile ledge members 2'. All of the constructional features which are not necessary for understanding the underlying concepts of the invention, for instance the supports for the profile ledge members, have been conveniently omitted from the drawings to preserve clarity in illustration, particularly since the structure constituting the same may be considered to be conventional.

As will be seen from FIG. 1, the V-shaped profile ledge members 1 and 2 are arranged mutually offset with respect to one another in two rows. The profile ledge members 2 of the second row, with respect to the flow direction, are provided with guide devices 3 forming channel walls. The spaces 1a between the V-shaped profile ledge members 1 of the first row are situated opposite the profile ledge members 2 of the second row. The flow directions are indicated by the unmarked arrows. The drift or blown sand is beneficially propelled by the deflected flow into zones of stagnating throughflow where it can deposit.

The variant embodiments illustrated in FIGS. 2 to 4 show substantially U-shaped profile ledge members or profile members 1' and 2', wherein the U-shaped profile ledge members 2' of the second row are equipped with guide devices 3, 3' and 3". The guide devices 3 of FIG. 2 are arranged essentially parallel to one another i.e. in parallel planes, as shown. The guide devices 3' and 3" in FIGS. 3 and 4 are arranged in a diffusor-like manner. FIG. 4 illustrates an embodiment where the guide devices 3" forming the channel walls are provided at their front portions with rounded surfaces 4 and are extremely advantageous from the standpoint of flow considerations. The guide devices 3" in FIG. 4 are mechanically connected in any suitable manner, as by the schematically indicated connection means 5, with the profile ledge members 2, whereas the guide devices 3 and 3' of FIGS. 1 to 3 are formed of one-piece with the profile ledge members 2.

Further, it will be seen from the showing of FIGS. 2, 3, and 4, that the substantially U-shaped profile ledge members or profile members 1', 2' are formed of three straight or linear lateral portions or legs 11, 12 of each of the U-shaped profile ledge members 1', 2' enclose an angle with the intermediate portion or web 10 which is greater than 90° and smaller than 160°. The respective rows of guide devices 3, 3' and 3" of FIGS. 1 to 4, forming the channel walls, are located downstream of the direction of flow of the cooling air.

The teachings of the invention are not limited of course to the exemplary embodiments shown in the drawings. Thus, for instance, the profile ledge members or profile members could exhibit a different shape from the depicted U-shape or V-shape, there could be used a greater number of rows of profile ledge members than illustrated and the angle, which the lateral portions or legs of the U-shaped profile ledge members enclose with the intermediate portion or web also can be greater or smaller than shown in the drawings.

While there are shown and described present preferred embodiments of the invention, it is to be distinctly understood that the invention is not limited thereto, but may be otherwise variously embodied and practiced within the scope of the following claims. Accordingly,

What is claimed is:

1. A protective screen, especially a protective grating for drift sand and the like, for an electrical air-cooled machine, comprising essentially vertical profile ledge members, said vertical profile ledge members being arranged in at least two rows, at least one row of guide devices provided for the vertical profile ledge members, said row of guide devices being located downstream of the flow direction of the cooling air, said guide devices forming channel walls defining a flow channel for the cooling air between each two neighboring channel walls of neighboring ones of the vertical profile ledge members provided with said row of guide devices.

2. The protective screen as defined in claim 1, wherein the guide devices are longer in the flow direction of the cooling air than the height of the profile ledge members in such flow direction.

3. The protective screen as defined in claim 1, wherein the profile ledge members possess an essentially V-shaped cross-section.

4. The protective screen as defined in claim 1, wherein the profile ledge members possess an essentially U-shaped cross section.

5. The protective screen as defined in claim 4, wherein the U-shaped cross-section of the profile ledge members comprises three substantially linear parts.

6. The protective screen as defined in claim 5, wherein each U-shaped cross-section of the profile ledge members has lateral portions merging with an intermediate portion, said lateral portions enclosing with the intermediate portion an angle greater than 90° and less than 160°.

7. The protective screen as defined in claim 3, wherein the profile ledge members are arranged in two rows defining a first row and a second row, each profile ledge member having an open portion, said open portions of the V-shaped profile ledge members being arranged in confronting relation, the profile ledge members of the second row being arranged in offset relationship with respect to the profile ledge members of the first row such that the space between each two neighboring profile ledge members of the first row is opposite a profile ledge member of the second row.

8. The protective screen as defined in claim 4, wherein the profile ledge members are arranged in two rows defining a first row and a second row, each profile ledge member having an open portion, said open portions of the U-shaped profile ledge members being arranged in confronting relation, the profile ledge members of the second row being offset with respect to the profile ledge members of the first row such that the space between each two neighboring profile ledge members of the first row is opposite a profile ledge member of the second row.

9. The protective screen as defined in claim 1, wherein the guide devices forming the channel walls are arranged in essentially parallel planes.

10. The protective screen as defined in claim 1, wherein the guide devices forming the channel walls are arranged in a diffusor-like manner.

11. The protective screen as defined in claim 1, wherein said guide devices include guide members, said profile ledge members for which there are provided said row of guide devices possessing front edges, viewed with respect to the direction of flow of the cooling air, at least one of said type of members being provided with substantially rounded surfaces.

12. The protective screen as defined in claim 11, wherein the rounded surfaces are provided at said profile ledge members for which there are provided said row of guide devices.

13. The protective screen as defined in claim 11, wherein said guide devices possess said substantially rounded surfaces.

14. The protective screen as defined in claim 1, wherein one of the rows of the profile ledge members is arranged downstream with respect to the flow direction of the cooling air, said downstream located row of profile ledge members being formed of one-piece with said guide devices.

* * * * *